United States Patent
Takahashi

(10) Patent No.: US 7,459,977 B2
(45) Date of Patent: Dec. 2, 2008

(54) SIGNAL TRANSFER CIRCUIT AND CIRCUIT DEVICE USING SAME

(75) Inventor: Akira Takahashi, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 11/238,004

(22) Filed: Sep. 28, 2005

(65) Prior Publication Data

US 2006/0072264 A1     Apr. 6, 2006

(30) Foreign Application Priority Data

Sep. 28, 2004    (JP)  .............. 2004-281027

(51) Int. Cl.
     *H03F 3/26*      (2006.01)
(52) U.S. Cl. .................... 330/288; 330/264
(58) Field of Classification Search ............... 330/262, 330/288, 264, 255, 267
See application file for complete search history.

(56) References Cited

U.S. PATENT DOCUMENTS 6,018,271 A *   1/2000   Yuasa .................... 330/288
6,696,895 B2 *   2/2004   Tsukuda ................ 330/264

* cited by examiner

*Primary Examiner*—Robert Pascal
*Assistant Examiner*—Hieu P Nguyen
(74) *Attorney, Agent, or Firm*—Mima Abyad; Wade J. Brady, III; Frederick J. Telecky, Jr.

(57) ABSTRACT

A signal transfer circuit appropriate for use in realizing both high circuit stability and high current driving ability is disclosed. Signal transfer circuit A has current transfer circuit 3 that transfers a signal current via first reference current I1. In one embodiment, current transfer circuit 3 has current transcription circuit 30 that transcribes signal current Is to first current portion I1-1 of first reference current I1, and output current path 32 that transfers the first current portion I1-1. In one embodiment, current transfer circuit 30 has first current branching circuit 300 and second current branching circuit 302.

4 Claims, 4 Drawing Sheets

PUSH-PULL
BUFFER D

PUSH-PULL
BUFFER E

OP-AMP CIRCUIT F

PUSH-PULL BUFFER G

US 7,459,977 B2

SIGNAL TRANSFER CIRCUIT AND CIRCUIT DEVICE USING SAME

The present invention relates to a signal transfer circuit, and to a push-pull circuit or other circuit device using such signal transfer circuit.

BACKGROUND

In a conventional semiconductor process, due to differences in structure, PNP transistors have a speed and current feeding ability inferior to those of NPN transistors. Consequently, when a push-pull buffer is formed in this process, usually only NPN transistors are used in the output stage.

FIGS. 9 and 10 show examples of the circuit configuration of push-pull buffers in the prior art. The output stage is comprised only of NPN transistors. More specifically, in the push-pull buffer shown in FIG. 9, NPN transistor Q1 and constant current source I2 comprise a circuit for forming reference base-emitter voltage Vbe1, and the output stage is comprised of push-side NPN transistor Q2 and pull-side NPN transistor Q7. The remaining portion of the buffer forms a control portion that controls pull-side NPN transistor Q7. In the feedback circuit comprised of the control portion, by means of a differential amplifier comprised of PNP transistors Q3, Q4, NPN transistors Q5, Q6, and constant current source I1, the difference between base-emitter voltage $Vbe_{Q1}$ and $Vbe_{Q2}$ of NPN transistors Q1 and Q2 is detected, and a current with a magnitude representing the difference is generated and it flows in Q5. Transistor Q5 converts the magnitude of collector current $Ic_{Q5}$ to collector voltage $Vc_{Q5}$ with a magnitude depending on collector current. Collector voltage $VC_{Q5}$ becomes the base-emitter voltage $Vbe_{Q7}$ of pull-side Q7 of the output stage, and, by controlling the magnitude of collector current $IC_{Q7}$ of Q7, a push-pull operation is realized.

For the circuit configuration shown in FIG. 9, the impedance of the collector of transistor Q5 at the terminal of the differential amplifier in the control portion is very high. As a result, transistor Q5 generates collector voltage $VC_{Q5}$ with a certain gain from collector current $IC_{Q5}$ that flows in it. This collector voltage $VC_{Q5}$ becomes base-emitter voltage $Vbe_{Q7}$ of transistor Q7, and an exponential function characteristic exists between the base-emitter voltage and collector current $IC_{Q7}$ of transistor Q7. Consequently, as collector voltage $VC_{Q5}$ of transistor Q5 varies, collector current $IC_{Q7}$ of pull-side transistor Q7 varies significantly, and the dynamic range of the collector current becomes wider. In this way, in the buffer circuit configuration shown in FIG. 9, it is possible to realize a high current driving ability of the buffer. This is an advantage. On the other hand, the collector node of Q3 is connected to the collector of Q5 and the base of Q7. This node has a high impedance, and, due to the presence of the high-impedance node at the base of Q7, combined with the parasitic capacitance between the base-collector of Q3 or the parasitic capacitance between base-collector of Q7 and its mirror effect capacitance, the circuit time constant of the control portion increases. The large circuit time constant generates a peak at low frequency. As a result, the delay in the phase at a high frequency increases, and the stability of the circuit at high frequency decreases. Especially, when a large capacitive load is connected to the output terminal OUT of the push-pull buffer, due to an increase in the phase delay due to the capacitive load and a decrease in the phase margin due to the increase in the phase delay at the collector mode of the Q3, oscillation may take place. In addition, lower stability of the circuit of the buffer becomes a reason for difficulty in increasing the operating speed of the circuit operation. Consequently, the conventional push-pull buffer circuit can hardly be used in applications with a large capacitive load connected.

On the other hand, the push-pull buffer with the circuit configuration shown in FIG. 10 has nearly the same configuration as that shown in FIG. 9. The difference is that the junction portion between the base and collector of Q5 at the terminal of the differential amplifier forms a low-impedance node. Due to this low-impedance node, the base voltage of Q7 becomes lower than that shown in FIG. 9, and it becomes equal to the nearly constant Vbe voltage of Q5. With the circuit configuration of FIG. 10, the low-impedance node in the control portion lowers the time constant of the feedback circuit that forms the control portion. As a result, the stability at high frequency increases, and it is easy to increase the circuit operating speed. This is an advantage. However, for the low-impedance node, the base voltage of Q5 generated from collector current $IC_{Q5}$ flowing in Q5 decreases, and hence the base voltage of Q7, decreases, and it nearly becomes a constant value without significant variation. In other words, due to the current mirror connection of Q5 and Q7, the current gain between collector current $IC_{Q5}$ of Q5 and collector current $IC_{Q7}$ of Q7 is unity. As a result, the dynamic range of collector current $IC_{Q7}$ of pull-side transistor Q7 becomes equal to the dynamic range of collector current $IC_{Q5}$ of Q5, and the dynamic range of collector current $IC_{Q5}$ of Q5 is limited by the variable range of the current flowing to the one branch of the differential amplifier containing it (the range from ½ of I1 to I1). As a result, the current driving ability of the buffer becomes lower, and this is undesired. Concerning the problem of low current driving ability, even with the current mirror connection of Q5 and Q7, and with a mirror current n-fold the collector current of Q5 flowing in Q7, there is still no change in the dynamic range of the collector current of Q7. Consequently, the aforementioned problem cannot be solved.

As explained above, in a conventional push-pull buffer, there is a trade-off relationship between the circuit stability and the current driving ability.

Thus, an object of the present invention is to provide a type of signal transfer circuit appropriate for realizing both high circuit stability and high current driving ability at the same time.

Another object of the present invention is to provide a type of circuit device containing the signal transfer circuit.

Yet another object of the present invention is to provide a type of push-pull buffer or other buffer equipped with the circuit device.

These and other objects of the present invention will be apparent from the following description.

SUMMARY OF THE INVENTION

In an embodiment of the present invention, the present invention provides a type of signal transfer circuit characterized by the following facts: the signal transfer circuit has a current transfer circuit that transfers a signal as a current, and the current transfer circuit transfers the signal current via a first reference current. The current transmission circuit may have a current transcription circuit that transcribes the signal current to a first portion of the first reference current, and an output current path that transfers the first portion of the first reference current. The current transcription circuit may have a first current branching circuit and a second current branching circuit; in the first current branching circuit, the signal current is transcribed to a first portion of a second reference current; the remaining portion of the second reference current other than the first portion is the second portion; and, in the second current branching circuit, the second portion of the second reference current is transcribed to the second portion of the first reference current other than the first portion, so that the signal current is transcribed to the first portion of the first reference current. The first current branching circuit may have a first branch for passing of the second reference current, a second branch for passing of the first portion of the second reference current, and a third branch for passing of the second portion of the second reference current; and the second current branching circuit has a first branch for passing of the first reference current, a second branch for passing of the second portion of the first reference current, and a third branch for passing of the first portion of the first reference current. The first portion of the second reference current can be changed in the range from zero to the magnitude of the second reference current, and the first portion of the first reference current can be changed in the range from the difference between the first reference current and the second reference current to the magnitude of the first reference current. The signal transfer path may contain a voltage-current converter that is positioned at the input terminal and generates a signal current depending on the voltage, and a current-voltage converter that is positioned at the output terminal and generates a voltage depending on the signal current. The current transfer path may contain at least one node, and each of the at least one node is a low-impedance node having a low impedance. The low-impedance node may have at least one low-impedance electrode that displays the low impedance of the 3-terminal device connected to the node. The 3-terminal device may be a bipolar transistor or an MOS transistor.

As another scheme of the present invention, a circuit device provided by the present invention has the signal transfer circuit. The circuit device may be used as a buffer and used as the output stage of an op-amp and reference voltage source.

As another scheme of the present invention, a type of circuit device is provided characterized by the fact that the circuit device has a first circuit, and a second circuit, with the second circuit connected to the first circuit and equipped with the signal transfer circuit. The second circuit may form a feedback circuit with respect to the first circuit. The feedback circuit may work such that the variation of a prescribed parameter in the first circuit is reduced. The variation in the prescribed parameter may become the error from the reference value of the parameter. The prescribed parameter may be the voltage pertaining to a 3-terminal device. The voltage pertaining to the 3-terminal device may be the base-emitter voltage of a bipolar transistor or the gate-source voltage of a MOS transistor. The first circuit may be a buffer circuit that has a reference voltage and a node that displays a prescribed voltage in agreement with the reference voltage, and the second circuit may be a circuit that works so that the prescribed voltage is in agreement with the reference voltage. The first circuit may be a push-pull buffer circuit that has a reference voltage and a node that displays a prescribed voltage in agreement with the reference voltage, and the second circuit may be a circuit that works so that the prescribed voltage is in agreement with the reference voltage.

As another scheme of the present invention, the present invention provides a type of buffer characterized by the following facts: the buffer has a first voltage follower, a second voltage follower, and a controller; the first voltage follower has a variable current source connected to the output of the first voltage follower, and the output of the first voltage follower is connected to the output terminal of the buffer; the second voltage follower has a constant current source connected to the output of the second voltage follower; and the controller controls the variable current source of the first voltage follower corresponding to the potential difference between the output of the first voltage follower and the output of the second voltage follower, and the controller transfers the signal in the form of a current.

As another scheme of the present invention, the present invention provides a type of push-pull circuit characterized by the fact that it has the following parts: an input terminal receiving an input signal, an output terminal for supplying an output signal, a first circuit that is electrically connected to the input terminal and supplies current to the output terminal, a second circuit that is electrically connected to the input terminal, is for supplying current to a first node, and is connected between the first node and a second node, a third circuit that is electrically connected between the output terminal and the first node, and converts the voltage between the output terminal and the first node to a current and supplies it as a first current, a first constant current source for supplying a first constant current to the second node, a second constant current source for supplying a second constant current to the first node, a fourth circuit that supplies the sum current of the first current and second current, which is the difference between the first constant current and the second constant current, and a fifth circuit that supplies a current corresponding to the sum current to the output terminal. The current range of the sum current is between the magnitude of the second current and the magnitude of the first current.

BRIEF DESCRIPTION OF THE DRAWINGS

Example embodiments of the invention are described, with reference to the accompanying drawings, wherein.

DETAILED DESCRIPTION OF EMBODIMENTS

According to the present invention, it is possible to provide a type of signal transfer circuit that has a low impedance and a wide dynamic range of current. By means of this signal transfer circuit, it is possible to realize both high circuit stability and a high current driving ability (a wide dynamic range of the output current), which have formerly had a trade-off relationship with each other. In addition, this can be realized by means a simple circuit configuration, so that it is possible to cut the cost.

Figure 1:
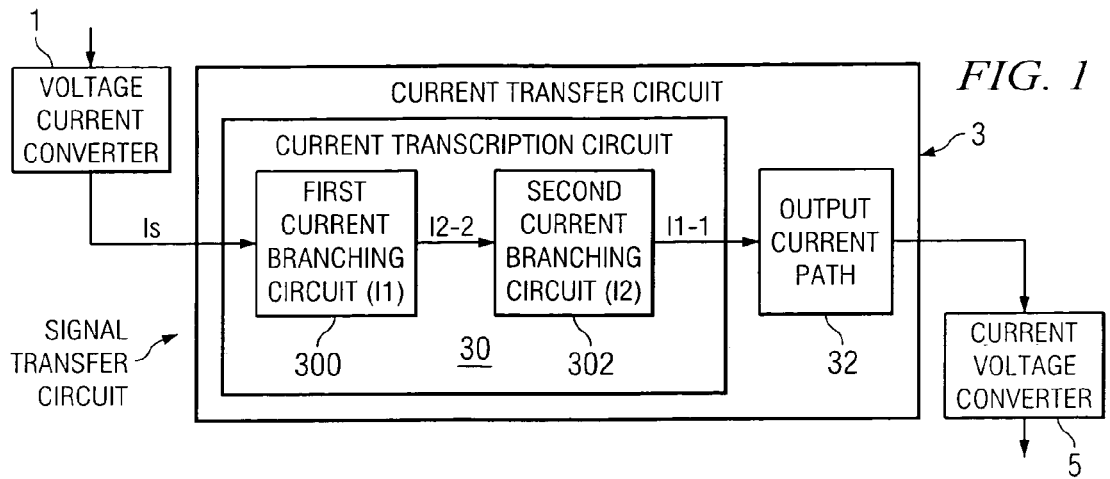
FIG. 1 is a block diagram of an embodiment of a signal transfer circuit according to the present invention;.

FIG. 1 is a block diagram illustrating a signal transfer circuit A in an embodiment of the invention. As shown, signal transfer circuit A has a voltage-current converter 1, a current transfer circuit 3, and a current-voltage converter 5. The current transfer circuit 3 has a current transcription circuit 30 and an output current path 32. Voltage-current converter 1 receives a signal in voltage form as input and converts the voltage to a current, so that a signal in current form is generated at the output. This signal current Is is coupled to the input of current transfer circuit 3, and current transfer circuit 3 transfers the signal current via a first reference current I1 to the output. The current transferred via the first reference current I1 is coupled to the input of current-voltage converter 5. Then, current-voltage converter 5 converts the transferred current to a voltage, and a signal in voltage form is generated at the output.

As illustrated with reference to FIG. 2, current transcription circuit 30 of current transfer circuit 3 receives signal current Is transcribed to first current portion I1-1 of first reference current I1, and the first current portion I1-1 is generated at the output. Output current path 32, that has the first current coupled to the input, transfers the first current portion I1-1 to the output.

In an embodiment of the invention, current transcription circuit 30 has first current branching circuit 300 and second current branching circuit 302. The first current branching circuit 300 receives second reference current I2 from a current source set inside it or outside it, and it transcribes signal current Is to first current portion I2-1 of second reference current I2 to generate an output. In this case, the portion of the second reference current other than first current portion I2-1 is second current portion I2-2. In other words, first current branching circuit 300 is for current computation. It performs a computation to subtract first current portion I2-1 corresponding to signal current Is from second reference current I2 to form second current portion I2-2. Second current branching circuit 302 receives first reference current I1 from a current source set inside or outside, and second current portion I2-2 of second reference current I2 received from first current branching circuit 300 is transcribed to second current portion I1-2 of first reference current I1 other than the first current portion. As a result, signal current Is is transcribed to first current portion I1-1 of first reference current I1. In other words, second current branching circuit 302 also performs a current computation. It performs a computation to subtract second current portion I1-2 corresponding to second current portion I2-2 from first reference current I1 to form first current portion I1-1. Also, when first reference current I1 is larger than second reference current I2, the difference α (=I2−I1) is contained in first current portion I1-1. In this way, first current portion I1-1 transcribed by signal current Is is output from second current branching circuit 302. First current portion I1-1 output in this way is coupled to the input of output current path 32, and it is output through the path.

Figure 2:
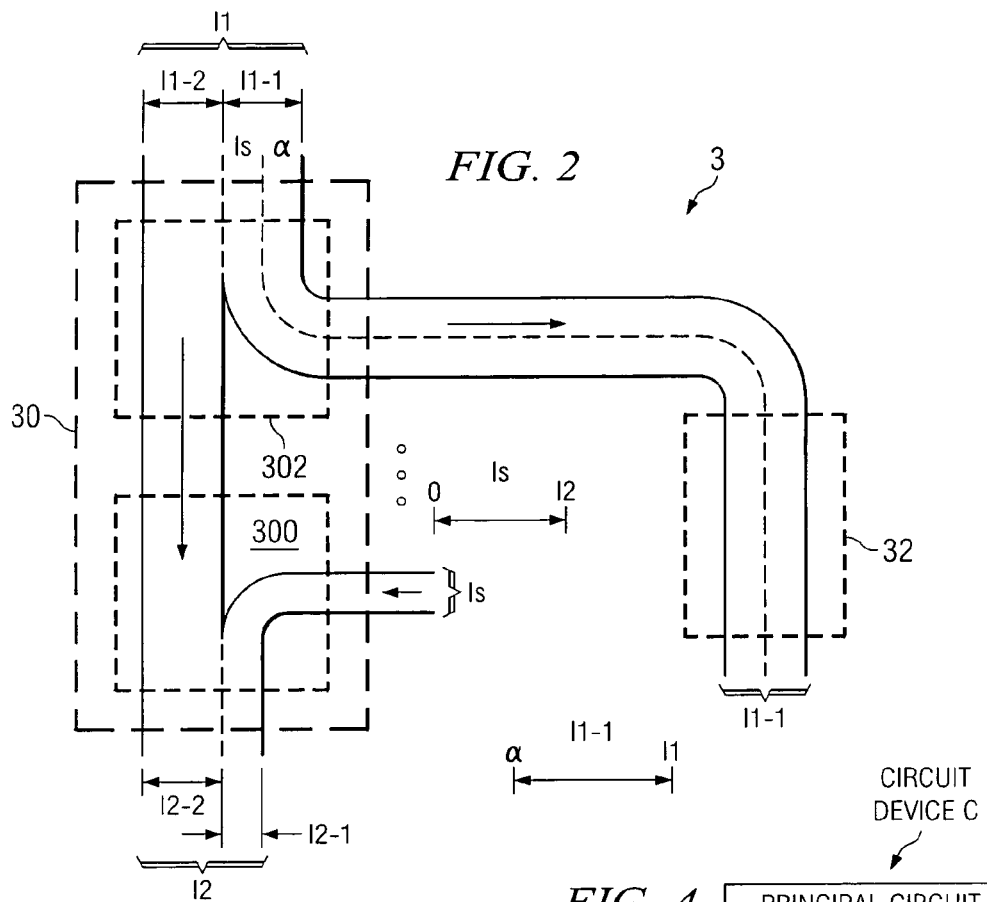
FIG. 2 is a circuit diagram illustrating the details of the current transfer circuit of FIG. 1 and showing the relationship with current flowing in the circuit.

As can be seen from FIG. 2, in current transfer circuit 3, signal current Is can be changed in the range from the magnitude of I2 to zero, and first current portion I1-1 containing Is can be changed in the range from I1 (as I1-1 max) to α (as I1-1 min). Consequently, dynamic range DR of the current that can be transferred with current transfer circuit 3 is as follows:

$$DR=(I1\text{-}1\ max)/(I1\text{-}1\ min)=I1/\alpha.$$

In this case, as α approaches zero, dynamic range DR becomes larger. When α is nearly zero, dynamic range DR can become infinitely large. In this way, in signal transfer circuit A of the present invention, it is possible to have a wider dynamic range of the current by means of the current transfer circuit as a low-impedance path.

In the embodiment of signal transfer circuit A shown in FIG. 1, transcription with current transcription circuit 30 is performed by mapping with a one-to-one relationship as shown in FIG. 2. However, it is also possible to perform mapping with a gain other than unity. In the current transfer circuit 30, the current transfer circuit may be realized in a significant current path that has influence on the operation of the current transfer circuit. Consequently, in some cases, the current transfer circuit may contain a current branch or current path other than the current transfer path. The current branches or current paths include current branches needed for performing the operation of the circuit for current transfer and unintended current branches, as well as current branches that do not have a significant influence on the dynamic range of the current to be transferred, etc. For example, they include base current, leakage current, etc. of transistors. In addition, in FIG. 2, output current path 32 is shown as a single current path. However, a single current path is not a necessity for transferring from second current branching circuit 302 to first current portion I1-1 as is. Consequently, output current path 32 may have plural branches, and this branch is only required to be of a proportional type in which the current flows in proportion to the magnitude of received first current portion I1-1. In this branch, too, just as in the case only one, it is possible to realize a wide current dynamic range. In addition, in the configuration shown in FIG. 1, when the signal is supplied in current form, there is no need to have voltage-current converter 1. On the other hand, when it is necessary to output the signal in current form, there is also no need to have current-voltage converter 5.

Figure 3:
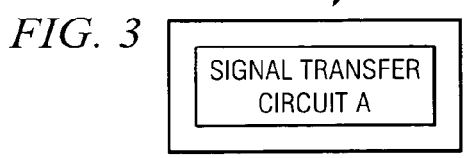
FIG. 3 is a block diagram illustrating a circuit device using the signal transfer circuit of FIG. 1.

FIG. 3 is a diagram illustrating circuit device B using signal transfer circuit A shown in FIG. 1. Circuit device B may be any circuit device, and, at least one of the various signal transfer paths in this circuit device is made of signal transfer circuit A shown in FIG. 1. In circuit device B, signal transfer circuit A shown in FIG. 1 can be used in the principal signal transfer path portion or in the principal circuit. Signal transfer circuit A can also be used in the transfer path of the following signal of circuit device B. Consequently, as signal transfer paths, for example, there may be signal transfer paths in the feedback circuit and various compensation circuits in circuit device B. Also, signal transfer circuit A may be used in any other signal transfer path so as to realize both a wide dynamic range and a low-impedance path in circuit device B.

Figure 4:
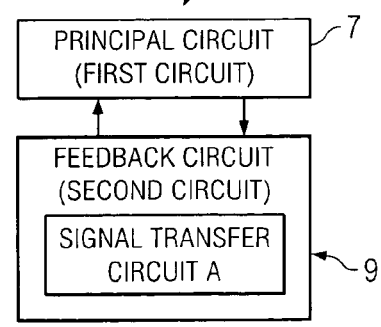
FIG. 4 is a block diagram illustrating a circuit device in an embodiment of the circuit device of FIG. 3.

In the following, with reference to FIG. 4, an explanation will be given regarding circuit device C in an embodiment of circuit device B. Circuit device C shown in the figure has principal circuit 7 as a first circuit, and feedback circuit 9 as a second circuit. For feedback circuit 9, the input is coupled to a certain site in principal circuit 7 (such as an output terminal of principal circuit 7), and the output is coupled to another site in principal circuit 7 (such as an input terminal of principal circuit 7 or any site between the input terminal and the output terminal). In the embodiment shown in FIG. 4, feedback circuit 9 has signal transfer circuit A shown in FIG. 1. With this configuration, the time constant in the portion of feedback circuit 9 is lowered, and, at the same time, the dynamic range of the signal current in the feedback circuit portion can be widened. As a result, by reducing the time constant of the overall circuit as a combination of the feedback circuit and principal circuit 7, it is possible to guarantee a desired signal dynamic range, and it is possible to increase the stability of the operation of the circuit of circuit device C.

In the following, with reference to FIG. 5, an explanation will be given regarding push-pull buffer D as a specific embodiment of circuit device C shown in FIG. 4. As shown in the figure, push-pull buffer D is comprised of input terminal IN and output terminal OUT, NPN transistors Q1, Q2, Q4 and Q5, PNP transistor Q3, two constant current sources I1 and I2, one constant voltage source E1, and one resistor R1.

More specifically, the push-pull buffer is mainly comprised of an output portion and a pull-side circuit control portion. The output portion has transistors Q2 and Q5. Q2 forms an emitter follower, with its base connected to input terminal IN, and its collector-emitter circuit connected between power source voltage Vcc and output terminal OUT, forming a push-side circuit that supplies current to output terminal OUT. On the other hand, Q5 has its collector-emitter circuit connected between output terminal OUT and ground, forming a pull-side circuit that pulls the current from output terminal OUT. This Q5 functions as a variable current source that can be controlled by the base voltage. The remaining circuit of push-pull buffer D is the pull-side circuit control portion. When Q5 is controlled as the pull-side circuit, the magnitude of the pull-in current from output terminal OUT can be controlled.

More specifically, the pull-side circuit control portion can roughly be divided into a reference voltage generator portion and a signal transfer circuit portion. The reference voltage generator portion has Q1. This Q1 has its base connected to input terminal IN, and has its collector-emitter circuit coupled between power source voltage Vcc and ground, and it forms an emitter follower. The emitter of Q1 is also called node N1, and its collector is also called N2. The voltage at node N1 is lower than voltage Vin of input terminal IN by base-emitter voltage $Vbe_{Q1}$ of Q1, and it works as a reference voltage with respect to the emitter voltage of Q2. The emitter voltage of Q2 is lower than voltage Vin of the input terminal IN by base-emitter voltage $Vbe_{Q2}$ of Q2. Also, the value of the base-emitter voltage $Vbe_{Q2}$ depends on the magnitude of the current flowing in the collector and then the emitter of Q2. Consequently, it decreases as the current pulled in from output terminal OUT becomes larger. Base-emitter voltage $Vbe_{Q1}$ of Q1 is steadier than base-emitter voltage $Vbe_{Q2}$ of Q2.

Just like signal transfer circuit A shown in FIG. 1, the signal transfer circuit portion is comprised of a voltage-current converter portion, a current transfer circuit portion, and a current-voltage converter portion. More specifically, the voltage-current converter portion is comprised of resistor R1 connected between output terminal OUT and node N1. The current transfer circuit portion is comprised of node N1, constant current sources I2 and I1, node N2, Q3 and Q4, and constant voltage source E1. The current-voltage converter is comprised of the base-emitter junction of Q4. For resistor R1, when a difference occurs in Vbe of Q1, Q2 due to the load connected to output terminal OUT, a voltage difference occurs between output terminal OUT and node N1, so that current $I_{R1}$, as shown in the figure, flows with a magnitude corresponding to the voltage difference. The current transfer circuit acts to transfer this current $I_{R1}$. Also, the magnitudes of constant currents I1, I2 are determined such that the current densities of transistors Q1 and Q2 are the same in the load-free state. Consequently, the two base-emitter voltages $Vbe_{Q1}$ and $Vbe_{Q2}$ are equal to each other, and no current flows in resistor R1.

More specifically, just in the aforementioned embodiment, the current transfer circuit portion is comprised of a first current branching circuit, a second current branching circuit, and an output current path. That is, node N1 is connected to one end of resistor R1, the emitter of Q1, and one end of current source I2 (the other end is grounded), and this node forms the first current branching circuit. Current $I_{R1}$ and emitter current $Ie_{Q1}$ of Q1 flow into this node N1, and constant current I2 flows out. Also, if the base current of Q1 is neglected, it is possible to assume that emitter current $Ie_{Q1}$ is equal to collector current $Ic_{Q1}$. Also, node N2 is connected to the collector of Q1, one end of constant current source I1 (the other end is connected to power source voltage Vcc), and the emitter of Q3, and this node forms the second current branching circuit. Constant current I1 flows into this node N2, and collector current $Ic_{Q1}$ of Q1 and emitter current $Ie_{Q3}$ of Q3 flow from it. The emitter-collector circuit of Q3 and the base-emitter circuit of Q4 form the output current path. The base of Q3 is connected to constant voltage source E1, and its collector is connected to node N3. The voltage value of constant voltage source E1 should be high enough to ensure that Q3 is always on independent of the magnitude of voltage Vin of input terminal IN. Q4 has its collector and base connected to node N3, and its emitter connected to ground. Also, Q4 has its base also connected to the base of pull-side transistor Q5. Q4 and Q5 form a current mirror circuit. As a result, a current with a magnitude corresponding to the current flowing in the collector of Q4 flows to the collector of Q5. When the transistor size of Q4 is the same as that of Q5, the collector current of Q4 and the collector current of Q5 are equal to each other. Here, collector current $Ic_{Q3}$ of Q3 flows into node N3, while base current $Ib_{Q4}$ of Q4 flows from it. If the bases of Q3 and Q4 are neglected, it is possible to assume that $Ic_{Q3}$ is equal to emitter current $Ic_{Q3}$. Consequently, collector current $Ic_{Q5}$ of Q5 is equal to the magnitude of collector current $Ic_{Q3}$ of Q3.

In the following, an explanation will be given regarding the operation of push-pull buffer D with the aforementioned configuration with reference to FIG. 2. The corresponding relationship of the various currents in the circuit shown in FIG. 5 to the currents in FIG. 2 is as follows:

I1 → first reference current I1
$Ie_{Q3}$ → first current portion I1-1
$Ic_{Q1}$ → second current portion I1-2
I2 → second reference current I2
$I_{R1}$ → first current portion I2-1
$Ie_{Q1}$ → second current portion I2-2

Figure 9:
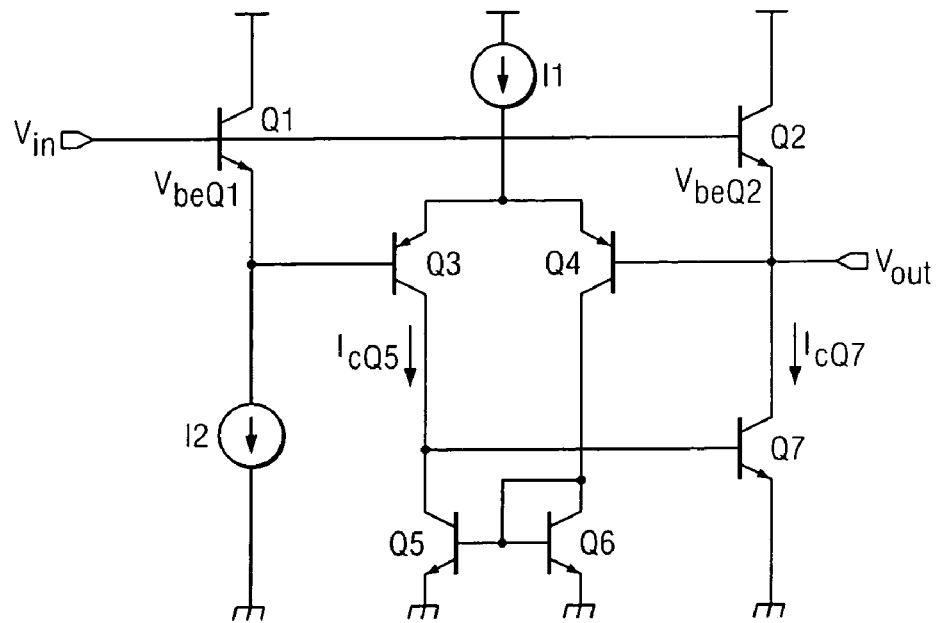
FIG. 9 (Prior Art) is a circuit diagram illustrating an example of the circuit configuration of a push-pull buffer of the prior art.
Figure 10:
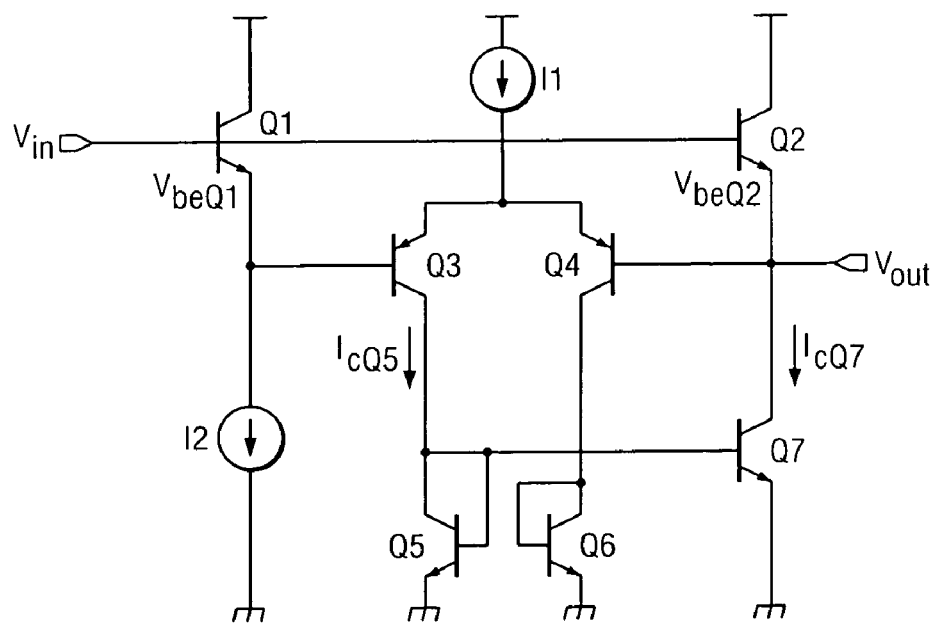
FIG. 10 (Prior Art) is a circuit diagram illustrating another example of the circuit configuration of a push-pull buffer of the prior art.

As can be seen from FIG. 2, signal current $I_{R1}$ is transcribed to the first portion of I2 by means of the current branching at node N1. Among I2 the remaining portion with respect to the first portion is the second portion $Ie_{Q3}$, and it is transcribed to second portion $Ic_{Q1}$ of constant current I1 at node N2. As a result, signal current $I_{R1}$ is finally transcribed to first portion $Ie_{Q3}$ as the remaining portion with respect to the second portion of I1. Here, it is not a necessity for $Ie_{Q3}$ to equal the magnitude of current $I_{R1}$. For example, if I1 is larger than I2, as explained above, a positive α (=I1−I2) is generated. If I1>I2, as shown in FIG. 2, it is possible for current $I_{R1}$ to vary from the magnitude of I2 as the maximum to zero as the minimum (this occurs when the voltage of output terminal OUT becomes equal to the voltage of node N1). As a result, collector current $Ic_{Q3}$ can vary from the magnitude of I1 as the maximum to the magnitude of α as the minimum. When α is small, as explained in FIG. 2, it is possible to expand the dynamic range of collector current $IC_{Q3}$ to infinity. This means that by means of the current mirror connection of Q4 and Q5, it is possible to expand the dynamic range of collector current $IC_{Q5}$ of pull-side transistor Q5 to infinity. As can be seen by comparing it with the conventional circuit configuration shown in FIG. 10, in the amplifier with a differential configuration shown in FIG. 10, only a current in the range ½ I1 to I1 (a narrow dynamic range) can be supplied to Q5. Also, a comparison indicates that the base voltage of Q5 generated by the current flowing in Q5 falls, and hence the base voltage of Q7, falls, and it is impossible to realize a wide dynamic range in the process of conversion of the current to voltage like in the circuit configuration shown in FIG. 9.

As explained above, in push-pull buffer D shown in FIG. 5, it is possible to expand the dynamic range of the current flowing in output terminal OUT. Also, this wide current dynamic range can be realized with a current transfer circuit. That is, in the current transfer circuit portion, node N1 is connected to the emitter of Q1, node N2 is connected to the emitter of Q3, and node N3 is connected to the base-collector junction portion where the base and collector of Q4 are connected to each other. In this field, it is well known that the collector of a transistor displays a high impedance, while the emitter and the base-collector junction of a transistor display low impedances, respectively. Consequently, nodes N1, N2, N3 in the current transfer circuit are all low-impedance nodes. As a result, the entire current transfer circuit portion has a low impedance with respect to the signal current, and a high-impedance node as is not present in a push-pull buffer of the prior art. Consequently, it is possible to maintain a very small time constant for the entirety of the pull-side circuit control portion. As a result, no peak of low frequency is generated, and high circuit stability can be realized. Consequently, for the push-pull buffer of the present invention with high circuit stability, even if a large capacitive load is connected to output terminal OUT, little decrease occurs in the phase margin, so that little possibility of oscillation exists. As a result, high-speed operation is possible. Also, the push-pull buffer of the present invention can be used as an output buffer even if a large load capacitance (with a magnitude impossible to use in a conventional circuit due to the high possibility of oscillation) is connected.

In the following, with reference to FIG. 6, an explanation will be given regarding push-pull buffer E in another embodiment. The part numbers corresponding to those in FIG. 5 are adopted for elements, currents, and voltages. As shown in the figure, push-pull buffer E is similar to that shown in FIG. 5, and it differs only in that transistor Q2 is comprised of three NPN transistors Q2a, Q2b, Q2c with their collector-emitter paths connected in parallel with respect to each other. Similarly, transistor Q5 is comprised of three NPN transistors Q5a, Q5b, Q5c having their collector-emitter paths connected in parallel with respect to each other, and a current 3-fold that in FIG. 5 flows through output terminal OUT. As a result, for example, it is possible for the magnitude of collector current $Ic_{Q3}$ to be ⅓ the current pulled in from output terminal OUT. If it is necessary for the buffer shown in FIG. 5 to have a large current driving ability, constant currents I1, I2 have to be large corresponding to the demand. Consequently, the overall consumption current of the buffer increases. On the other hand, in push-pull buffer E shown in FIG. 6, it is possible to realize the same current driving ability as that in FIG. 5 with ⅓ the collector current $Ic_{Q3}$. Consequently, it is possible to reduce constant currents I1, I2 corresponding to this, and it is possible to reduce the power consumption. Also, in the example shown in the figure, the number of transistors connected in parallel is 3. However, this is merely an example, and one may adopt more or less.

In the following, with reference to FIG. 7, an explanation will be given regarding op-amp circuit F using the push-pull buffer shown in FIG. 5. The same part numbers as those adopted in FIG. 5 are used to represent the corresponding elements, currents and voltages. As shown in the figure, op-amp circuit F is similar to the circuit shown in FIG. 5, and it differs only in that op-amp OPA is added. That is, the non-inverted input terminal of op-amp OPA is connected to input terminal IN, and its inverted input terminal is connected to output terminal OUT. The output is connected to the bases of Q1 and Q2. In other words, by using the push-pull buffer shown in FIG. 5 as the output stage of op-amp OPA, it is possible to realize a voltage buffer with a high current driving ability. When Vin is a fixed value, op-amp circuit F shown in FIG. 7 can work as a constant voltage source with a high current driving ability.

Figure 5:
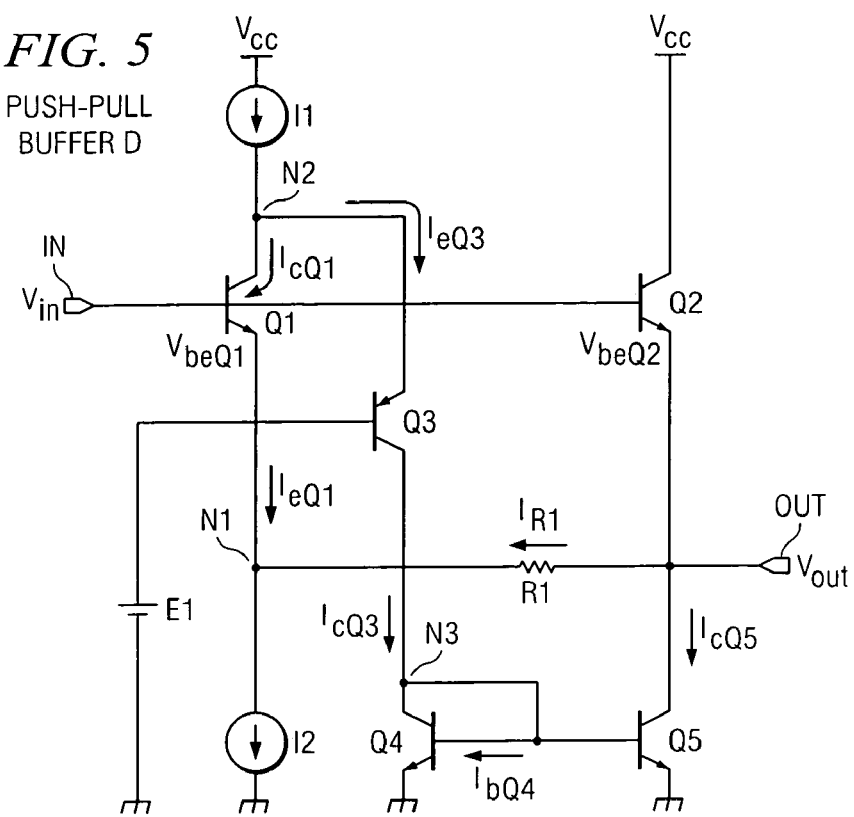
FIG. 5 is a circuit diagram illustrating a push-pull buffer as an embodiment of the circuit device of FIG. 4.
Figure 6:
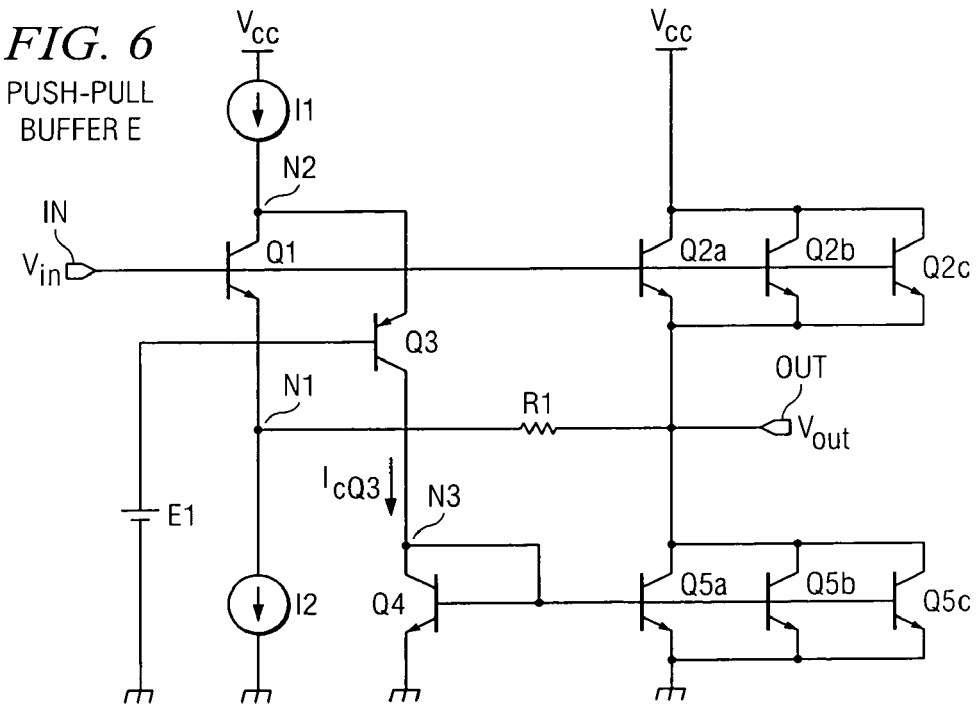
FIG. 6 is a circuit diagram illustrating a push-pull buffer in yet another embodiment of the present invention.
Figure 7:
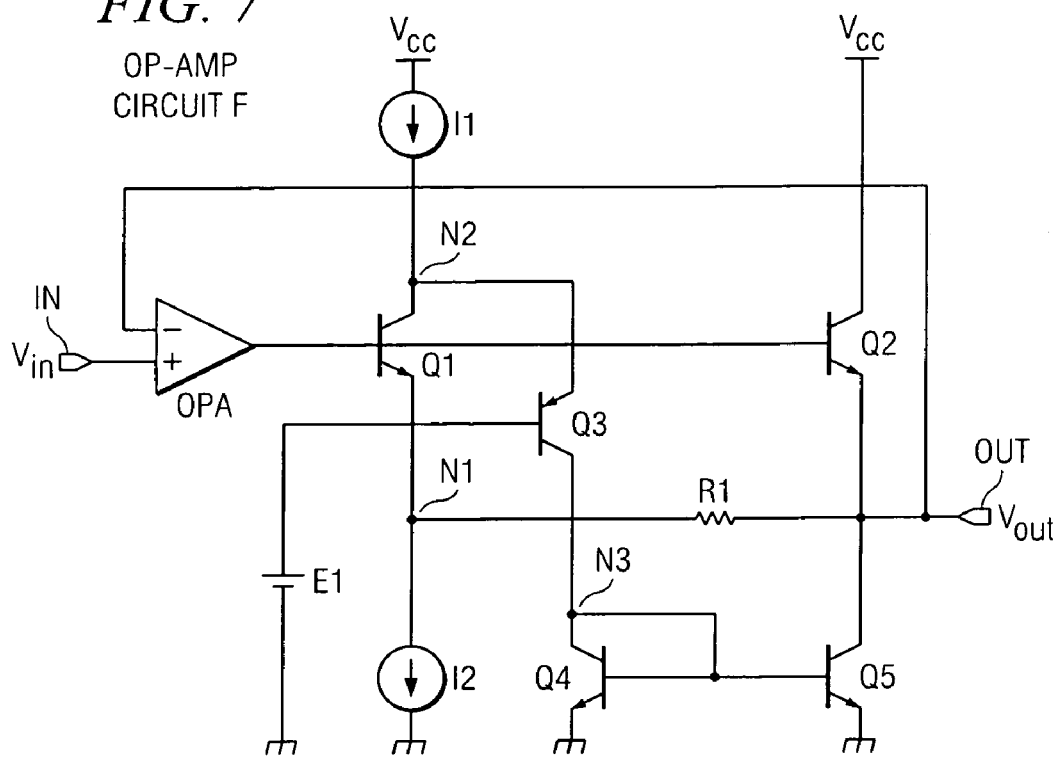
FIG. 7 is a circuit diagram illustrating an op-amp in an embodiment using the push-pull buffer of FIG. 5.

Here, an example with the buffer shown in FIG. 5 contained in op-amp circuit F shown in FIG. 7 is presented. However, one may adopt the buffer shown in FIG. 6 instead. Also, in op-amp circuit F shown in FIG. 7, in addition to op-amp OPA, the voltage buffer also has a push-pull buffer. However, one may also use the push-pull buffer shown in FIG. 5 as the output stage set in any op-amp circuit.

In the following, with reference to FIG. 8, an explanation will be given regarding push-pull buffer G as another embodiment. The same part numbers as those in FIG. 5 are adopted for the elements, currents and voltages. The push-pull buffer G shown in the figure has the same circuit configuration as that shown in FIG. 5, except that MOS transistors are used instead of bipolar transistors. That is, the NPN transistors and PNP transistor are replaced by NMOS transistors M1, M2, M4, M5 and PMOS transistor M3, respectively. In this way, when MOS transistors are used as substituents, the same operation as that of the push-pull buffer shown in FIG. 5 can be realized. Also, the concept of the circuit operation is the same as that shown in FIG. 5. Consequently, a detailed explanation will not be repeated.

Figure 8:
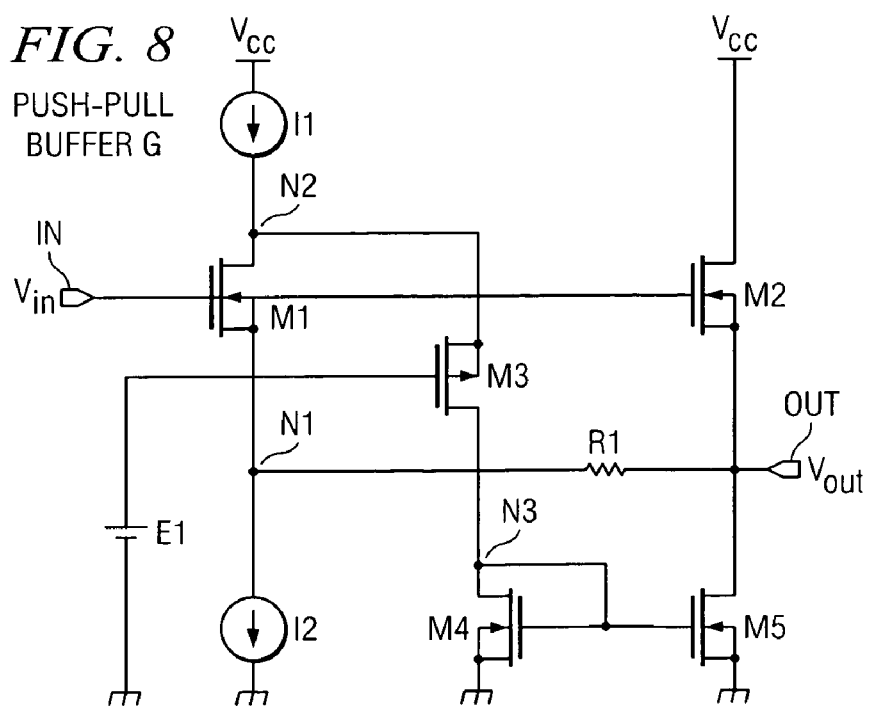
FIG. 8 is a circuit diagram illustrating a push-pull buffer in another embodiment of the present invention.

For push-pull buffer G shown in FIG. 8, the same change as that shown in FIG. 6 (that is, parallel connection of the drain-source paths of the MOS transistors of M2 and M5) may be performed. Also, a push-pull buffer of the MOS transistor form may be adopted in the circuit shown in FIG. 7 and other circuits.

In the above, several embodiments of the present invention have been explained in detail. As can be understood by a person skilled in the art, the push-pull buffer of the present invention may also be used as a voltage buffer or a constant voltage source. Also, in the embodiments, a resistor is used as the voltage-current converter. However, this is merely an example, and one may also adopt an MOS transistor or other resistance means instead of the resistor. In addition, the push-pull buffers or other circuits shown above with reference to figures are merely examples of the application of the signal transfer circuit of the present invention, and, it is clear for a person skilled in the art that the signal transfer circuit of the present invention may also be applied in various other types of circuits.

The invention claimed is:

1. A push-pull circuit comprising:
   an input terminal receiving an input signal;
   an output terminal for supplying an output signal;
   a first circuit that is electrically connected to the input terminal, receives a second current from the input terminal, and supplies current to the output terminal;
   a second circuit electrically connected to the input terminal, connected between a first node and a second node, for supplying current to the first node;
   a third circuit electrically connected between the output terminal and the first node, for converting the voltage difference between the output terminal and the first node to a current and providing it as a first current;
   a first constant current source for supplying a first constant current to the second node;
   a second constant current source for supplying a second constant current to the first node;

a fourth circuit that supplies the sum current of the first current and the second current, which is the difference between the first constant current and the second constant current; and a fifth circuit that supplies a current corresponding to the sum current to the output terminal.

2. The push-pull circuit described in claim 1 wherein the sum current has a current range that is between the magnitude of the second current and the magnitude of the first current.

3. The push-pull circuit described in claim 1 wherein the first circuit has a first transistor; the second circuit has a second transistor; the fourth circuit has a third transistor; the fifth circuit has a current mirror circuit; and the third circuit has a resistor.

4. The push-pull circuit described in claim 3 wherein:
the first transistor is an NPN transistor with its base connected to the input terminal;

the second transistor is an NPN transistor with its base connected to the input terminal, its emitter connected to the first node, and its collector connected to the second node;

the third transistor is a PNP transistor with its base connected to a constant voltage source and its emitter connected to the second node;

the current mirror circuit has a fourth NPN transistor with its collector and base connected to the collector of the PNP transistor, and a fifth NPN transistor with its base connected to the base of the fourth NPN transistor and its collector connected to the output terminal; and the resistor is connected between the output terminal and the first node.

* * * * *